(12) United States Patent
Kim et al.

(10) Patent No.: US 8,617,347 B2
(45) Date of Patent: Dec. 31, 2013

(54) VACUUM PROCESSING CHAMBERS INCORPORATING A MOVEABLE FLOW EQUALIZER

(75) Inventors: Jisoo Kim, Pleasanton, CA (US); Thorsten B. Lill, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 687 days.

(21) Appl. No.: 12/537,179

(22) Filed: Aug. 6, 2009

(65) Prior Publication Data
US 2011/0031214 A1 Feb. 10, 2011

(51) Int. Cl.
*H01L 21/306* (2006.01)
*C23F 1/00* (2006.01)
*C23C 16/455* (2006.01)
*C23C 16/06* (2006.01)
*C23C 16/22* (2006.01)

(52) U.S. Cl.
USPC ............ 156/345.26; 156/345.31; 156/345.33; 156/345.34; 156/345.54; 118/715; 118/719; 118/729

(58) Field of Classification Search
USPC ........ 118/715, 719, 729; 156/345.26, 345.31, 156/345.33, 345.34, 345.54
See application file for complete search history.

(56) References Cited

U.S. PATENT DOCUMENTS

| | | | | |
|---|---|---|---|---|
| 4,681,773 A | * | 7/1987 | Bean | 427/255.5 |
| 4,879,970 A | * | 11/1989 | Barkalow et al. | 118/719 |
| 5,210,055 A | * | 5/1993 | Nakaguma et al. | 438/710 |
| 5,266,119 A | * | 11/1993 | Taniguchi et al. | 118/730 |
| 5,314,574 A | * | 5/1994 | Takahashi | 438/706 |
| 5,540,821 A | * | 7/1996 | Tepman | 204/192.13 |
| 5,647,912 A | * | 7/1997 | Kaminishizono et al. | 118/719 |
| 5,855,681 A | * | 1/1999 | Maydan et al. | 118/719 |
| 5,891,350 A | * | 4/1999 | Shan et al. | 216/71 |
| 5,902,088 A | * | 5/1999 | Fairbairn et al. | 414/217 |
| 5,909,994 A | * | 6/1999 | Blum et al. | 414/217 |
| 5,911,834 A | * | 6/1999 | Fairbairn et al. | 134/1.3 |
| 6,120,609 A | * | 9/2000 | Selyutin et al. | 118/728 |
| 6,143,082 A | * | 11/2000 | McInerney et al. | 118/719 |
| 6,235,656 B1 | * | 5/2001 | Clarke | 438/800 |
| 6,261,408 B1 | * | 7/2001 | Schneider et al. | 156/345.26 |
| 6,319,553 B1 | * | 11/2001 | McInerney et al. | 427/250 |
| 6,391,147 B2 | * | 5/2002 | Imafuku et al. | 156/345.47 |
| 6,413,321 B1 | * | 7/2002 | Kim et al. | 118/725 |

(Continued)

FOREIGN PATENT DOCUMENTS

JP 2006057162 A * 3/2006

*Primary Examiner* — Rudy Zervigon
(74) *Attorney, Agent, or Firm* — Blakely, Sokoloff, Taylor & Zafman LLP

(57) ABSTRACT

A method and apparatus for vacuum processing of a workpiece, the apparatus including a flow equalizer disposed in a vacuum processing chamber between a workpiece support pedestal and a pump port located in a wall of the vacuum processing chamber. In an embodiment, the flow equalizer has a first annular surface concentric about the workpiece support pedestal to provide conductance symmetry about the workpiece support even when the pump port is asymmetrically positioned within the vacuum processing chamber. In an embodiment, the flow equalizer has a second annular surface facing a lower surface of the workpiece support pedestal to restrict conductance as the flow equalizer is moved is response to a chamber pressure control signal. In an embodiment, the apparatus for vacuum processing of a workpiece includes tandem vacuum processing chambers sharing a vacuum pump with each tandem chamber including a flow equalizer to reduce cross-talk between the tandem chambers.

12 Claims, 6 Drawing Sheets

(56) References Cited

U.S. PATENT DOCUMENTS

| | | | |
|---|---|---|---|
| 6,513,452 B2 * | 2/2003 | Shan et al. | 118/723 E |
| 6,562,141 B2 * | 5/2003 | Clarke | 118/719 |
| 6,591,850 B2 * | 7/2003 | Rocha-Alvarez et al. | 137/9 |
| 6,635,115 B1 * | 10/2003 | Fairbairn et al. | 118/719 |
| 6,752,874 B2 * | 6/2004 | Shim et al. | 118/719 |
| 6,843,882 B2 * | 1/2005 | Janakiraman et al. | 156/345.29 |
| 6,931,619 B2 * | 8/2005 | Buxbaum et al. | 430/5 |
| 6,962,644 B2 * | 11/2005 | Paterson et al. | 156/345.28 |
| 7,052,576 B2 * | 5/2006 | Park et al. | 156/345.24 |
| 7,276,122 B2 * | 10/2007 | Devine et al. | 118/719 |
| 7,422,636 B2 * | 9/2008 | Ishizaka | 118/719 |
| 7,552,521 B2 * | 6/2009 | Fink | 29/557 |
| 7,560,376 B2 * | 7/2009 | Escher et al. | 438/622 |
| 7,566,368 B2 * | 7/2009 | Saigusa et al. | 118/715 |
| 7,566,379 B2 * | 7/2009 | Nishimoto et al. | 156/345.43 |
| 7,566,891 B2 * | 7/2009 | Rocha-Alvarez et al. | 250/504 R |
| 7,589,336 B2 * | 9/2009 | Kaszuba et al. | 250/504 R |
| 7,618,493 B2 * | 11/2009 | Yamada et al. | 118/715 |
| 7,655,092 B2 * | 2/2010 | Fairbairn et al. | 118/719 |
| 7,663,121 B2 * | 2/2010 | Nowak et al. | 250/455.11 |
| 7,763,115 B2 * | 7/2010 | Hatanaka et al. | 118/719 |
| 7,777,198 B2 * | 8/2010 | Rocha-Alvarez et al. | 250/455.11 |
| 7,794,546 B2 * | 9/2010 | Li | 118/733 |
| 7,815,767 B2 * | 10/2010 | Sato | 156/345.47 |
| 7,828,900 B2 * | 11/2010 | Hatanaka et al. | 118/719 |
| 7,845,309 B2 * | 12/2010 | Condrashoff et al. | 118/723 E |
| 7,909,595 B2 * | 3/2011 | Kaszuba et al. | 425/174.4 |
| 7,964,858 B2 * | 6/2011 | Yang et al. | 250/504 R |
| 8,043,430 B2 * | 10/2011 | Dhindsa et al. | 118/715 |
| 8,057,600 B2 * | 11/2011 | Nishimoto et al. | 118/715 |
| 8,066,815 B2 * | 11/2011 | Devine et al. | 118/719 |
| 8,117,986 B2 * | 2/2012 | Saigusa et al. | 118/723 R |
| 8,118,936 B2 * | 2/2012 | Saigusa et al. | 118/715 |
| 8,118,938 B2 * | 2/2012 | Carducci et al. | 118/715 |
| 8,197,636 B2 * | 6/2012 | Shah et al. | 156/345.32 |
| 2002/0000194 A1 * | 1/2002 | Clarke | 118/715 |
| 2002/0056414 A1 * | 5/2002 | Shim et al. | 118/719 |
| 2002/0088547 A1 * | 7/2002 | Tomoyasu et al. | 156/345.47 |
| 2002/0092471 A1 * | 7/2002 | Kang et al. | 118/715 |
| 2003/0139035 A1 * | 7/2003 | Yim et al. | 438/643 |
| 2003/0176074 A1 * | 9/2003 | Paterson et al. | 438/710 |
| 2004/0055636 A1 * | 3/2004 | Rocha-Alvarez et al. | 137/9 |
| 2005/0051268 A1 | 3/2005 | Han et al. | |
| 2005/0241579 A1 * | 11/2005 | Kidd | 118/715 |
| 2005/0247265 A1 * | 11/2005 | Devine et al. | 118/719 |
| 2005/0268852 A1 * | 12/2005 | Hatanaka et al. | 118/723 VE |
| 2006/0213439 A1 * | 9/2006 | Ishizaka | 118/715 |
| 2006/0249175 A1 * | 11/2006 | Nowak et al. | 134/1 |
| 2006/0251827 A1 * | 11/2006 | Nowak et al. | 427/558 |
| 2007/0116873 A1 * | 5/2007 | Li et al. | 427/248.1 |
| 2007/0209590 A1 * | 9/2007 | Li | 118/719 |
| 2007/0212484 A1 * | 9/2007 | Li | 427/248.1 |
| 2007/0286963 A1 * | 12/2007 | Rocha-Alvarez et al. | 427/508 |
| 2008/0202423 A1 * | 8/2008 | Hatanaka et al. | 118/723 VE |
| 2008/0241384 A1 * | 10/2008 | Jeong et al. | 427/255.29 |
| 2010/0291319 A1 * | 11/2010 | Yamashita et al. | 427/575 |

* cited by examiner

VACUUM PROCESSING CHAMBERS INCORPORATING A MOVEABLE FLOW EQUALIZER

BACKGROUND

1. Field

Embodiments of the present invention relate to the electronics manufacturing industry and more particularly to a vacuum processing apparatus.

2. Discussion of Related Art

Vacuum processing systems are ubiquitous in microelectronics manufacturing. Many vacuum processing systems include a processing chamber designed for processing a workpiece with a plasma discharge. One such chamber generally includes a first and second electrode arranged in a parallel plate configuration. At least one of the electrodes is powered by a generator typically operating at an industrial RF band. Each electrode is typically a planar, circular disc to be substantially the same shape, albeit of a larger diameter, as a workpiece to be processed (e.g., a semiconductor wafer). It is conventional to pump down the processing chamber to sub-atmospheric pressures (i.e., vacuum) using a vacuum pump coupled to the chamber via a pump port. A process pressure may be controlled to a vacuum level using a gate valve between the chamber pump port and the vacuum pump.

Depending on the configuration of vacuum processing chamber and the location of the chamber pump port, gas conductance within the vacuum processing chamber may be either symmetrical or asymmetrical. Conductance asymmetry is exacerbated as conductance is increased (e.g., high total flow, low chamber pressures, etc.). Conductance asymmetry may limit process uniformity to as low as 10% across the workpiece. For this reason, it is conventional to position the pump port within the processing chamber at a physical location which is symmetrical with respect to the workpiece.

However, it may be desirable to position the pump port asymmetrically within a chamber, for example to one side of a chamber as in the tandem chamber processing apparatus described in U.S. Pat. No. 6,962,644 to Paterson et al. and assigned to Applied Materials, Inc. of California. As such, it may be useful to improve conductance symmetry in such a configuration as well as reduce any cross-talk that could occur between tandem chambers while still maintaining the numerous advantages of the tandem design.

SUMMARY

Embodiments of the present invention describe method and apparatus for vacuum processing of a workpiece, the apparatus including a flow equalizer disposed in a vacuum processing chamber to improve conductance symmetry and improve control of process pressure at a region local the workpiece. As described, the flow equalizer provides control of gas conductance such that the conductance is made symmetrical about a workpiece. Embodiments of the flow equalizer may also decouple the processing pressure above the workpiece from a pump-side gate valve by variably restricting fluid conductance with the flow equalizer in response to a workpiece-side pressure control signal.

In an embodiment, a flow equalizer is disposed in a vacuum processing chamber between a workpiece support pedestal and a pump port located in a wall of the vacuum processing chamber. The flow equalizer may have a first annular surface concentric about the workpiece support pedestal to provide conductance symmetry about the workpiece support even when the pump port is asymmetrically positioned relative to a longitudinal axis of the vacuum processing chamber. In an embodiment, the flow equalizer has a second annular surface facing a lower surface of the workpiece support pedestal to restrict conductance as the flow equalizer is moved is response to a pressure control signal.

In an embodiment, the apparatus for vacuum processing of a workpiece includes tandem vacuum processing chambers sharing a vacuum pump with each tandem chamber including a flow equalizer to provide independent process pressure control. Even though the tandem chambers are coupled to a shared vacuum pump via a shared pump port and/or chamber exhaust plenum, the flow equalizer within each tandem chamber may reduce or eliminate cross-talk between the tandem chambers.

BRIEF DESCRIPTION OF THE DRAWINGS

Embodiments of the invention are particularly pointed out and distinctly claimed in the concluding portion of the specification. Embodiments of the invention, however, both as to organization and method of operation, together with objects, features, and advantages thereof, may best be understood by reference to the following detailed description when read with the accompanying drawings in which:

DETAILED DESCRIPTION

Embodiments of are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known equipment design and process control techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

Figure 1:
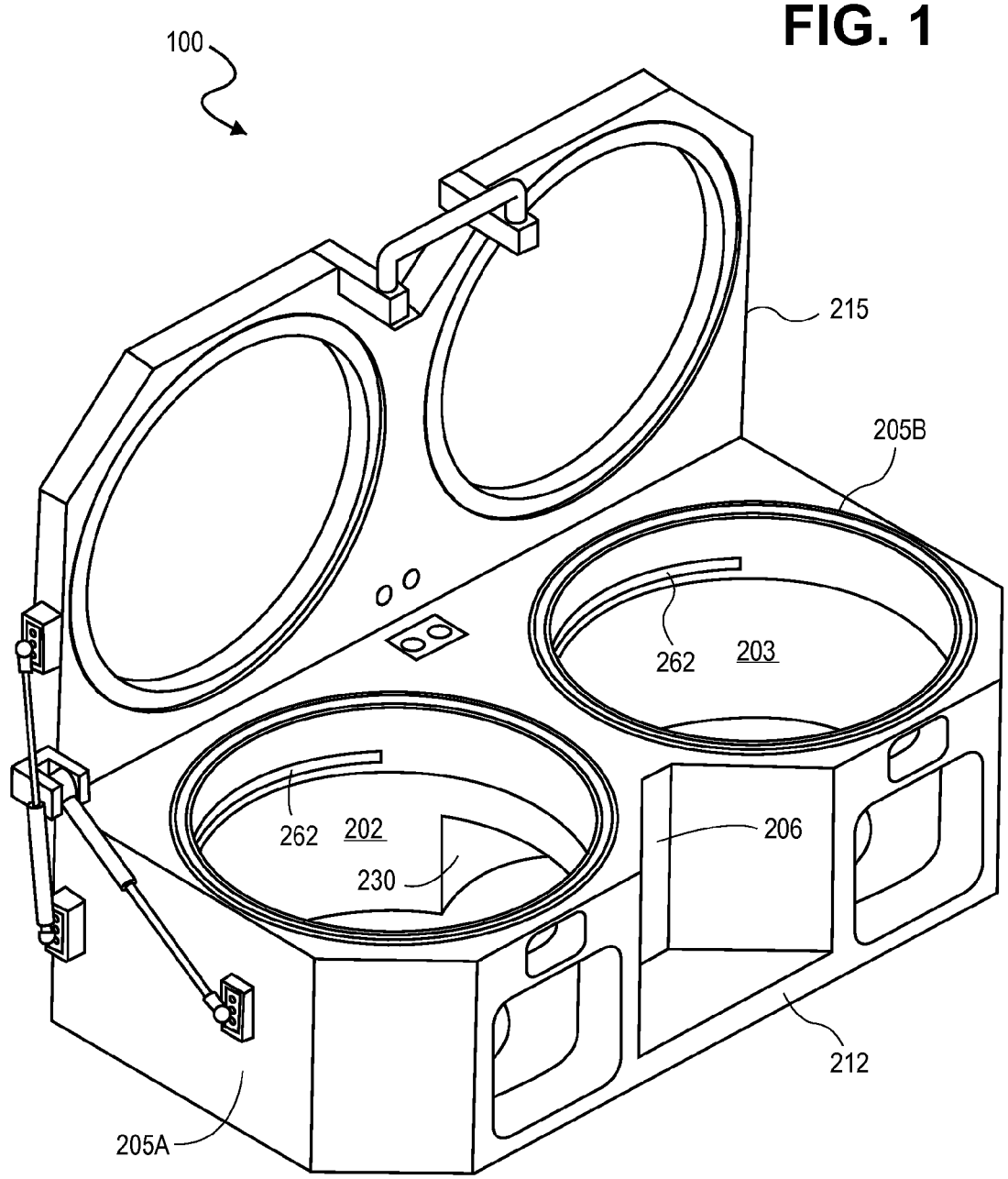
FIG. 1, is an isometric view of a portion of a tandem etch chamber, in accordance with one embodiment.
Figure 2:
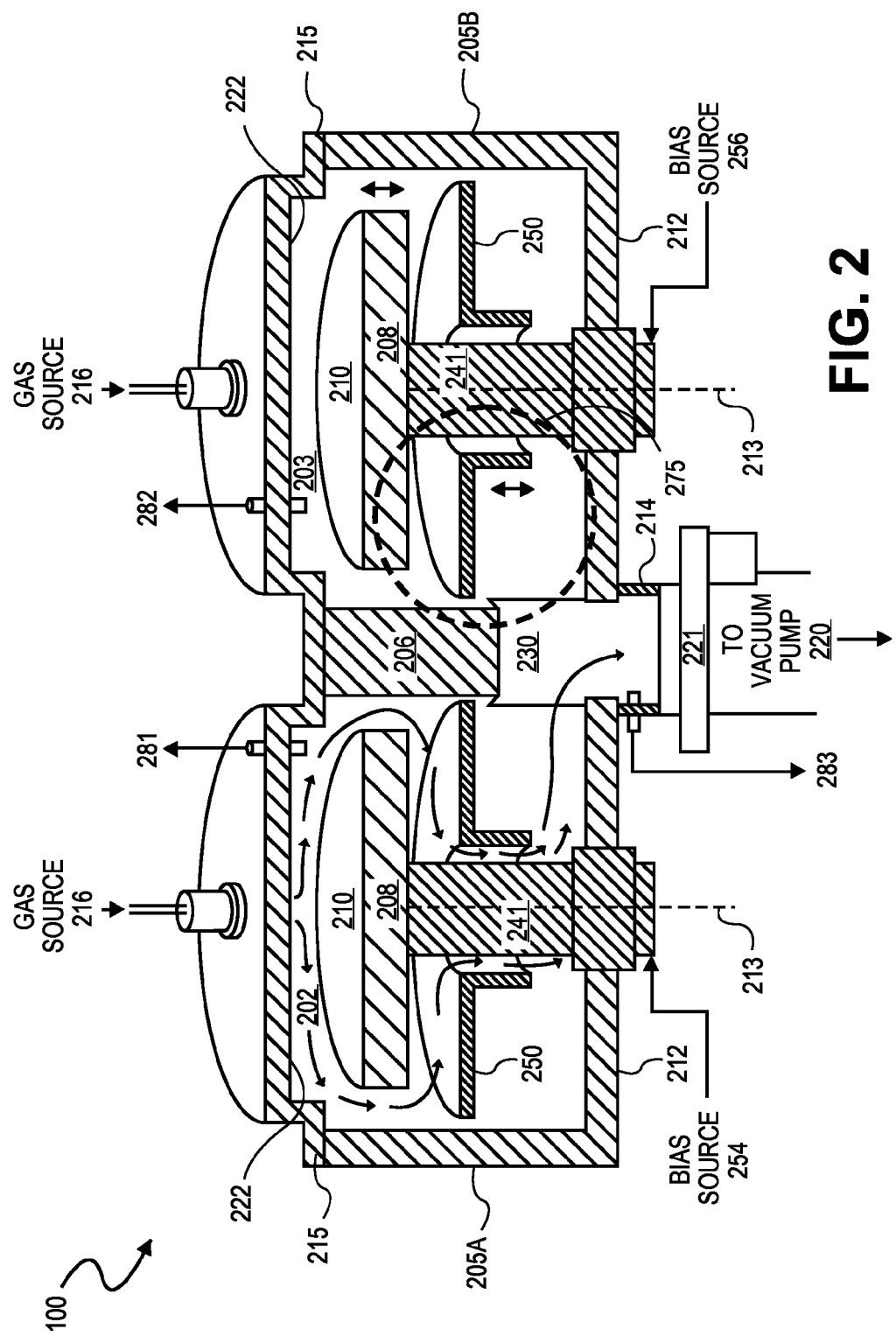
FIG. 2, is sectional view of a portion of the tandem vacuum processing system depicted in FIG. 1, in accordance with one embodiment.

FIGS. 1 and 2 illustrate a perspective view and sectional views, respectively, of an exemplary tandem vacuum processing system 100 in accordance with embodiments of the present invention. A tandem vacuum process system similar to that depicted in FIGS. 1 and 2 is commercially available as the Producer® Etch System from Applied Material, Inc. of CA. However, embodiments of the present invention may be adapted to other vacuum processing systems, such as deposition, etching and plasma treatment systems, including those where the processing chambers are not configured in tandem.

Each of the respective first and second tandem processing chambers 202, 203 generally includes a loading aperture 262. Each of the respective first and second tandem processing chambers 202, 203 include sidewalls 205A,B, a shared interior wall 206, a chamber bottom 212, and a lid 215 to enclose the chambers. The lid 215 includes a gas source assembly 216 having a showerhead 222 configured to dispense a gas into the respective tandem processing chamber 202 and 203.

Figure 3:
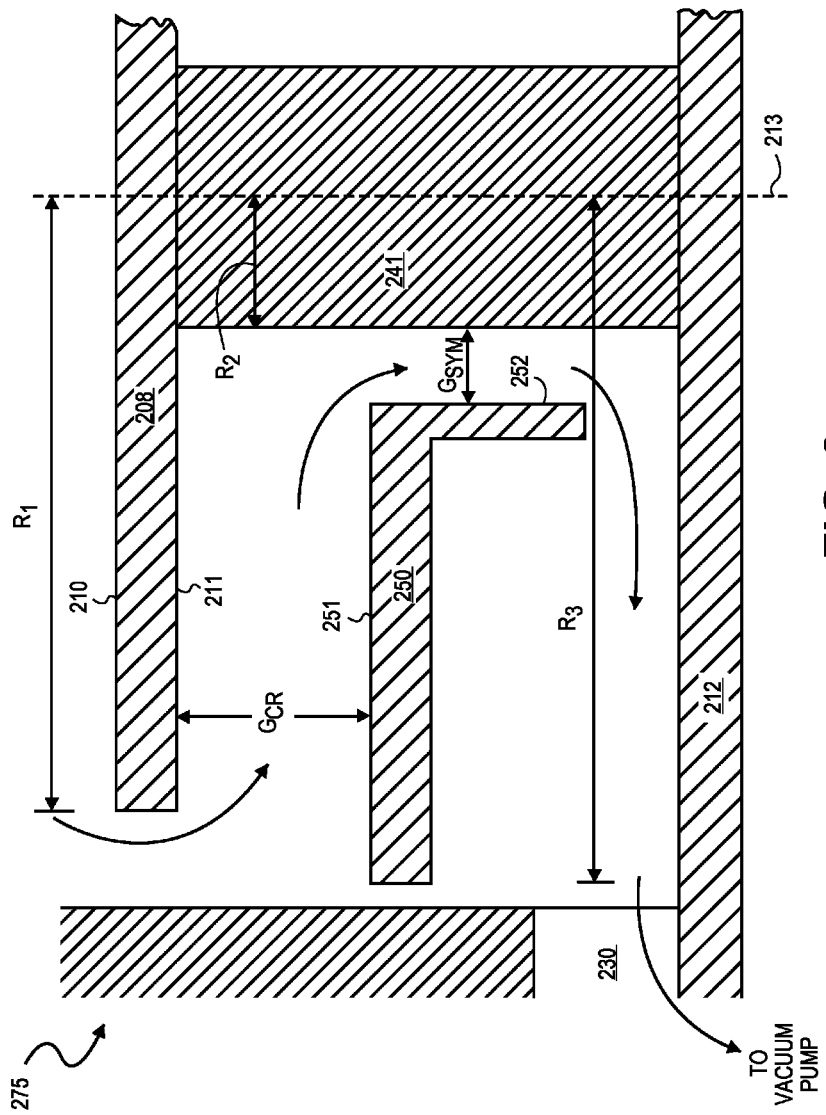
FIG. 3 is a sectional view of a portion of the tandem etch chamber depicted in FIG. 1, in accordance with one embodiment.

FIG. 2 depicts an isometric cross-sectional view of a workpiece support 208 disposed within each of the processing chambers 202 and 203. The workpiece support 208 is generally of sufficient area to support a workpiece, for example a semiconductor wafer. A center of the workpiece support 208 is disposed along a longitudinal chamber axis 213 of the processing chamber and extends a radius $R_1$ from the axis 213 (FIG. 3). As illustrated, the workpiece support 208 may be movable in a vertical direction, i.e., in the direction along a stem 241 extending a radius $R_2$ from the axis 213. To electrically bias plasma toward and away from the workpiece support 208, electrical bias sources 254 and 256 may be coupled to a respective bias electrodes disposed within the workpiece supports 208 via the stem 241. The workpiece support 208 may further include an electrostatic chuck (not depicted) or other clamping means known in the art to provide a stable working position for a workpiece supported on the top surface 210.

The sidewall 205A, shared interior wall 206, and portion of the lid 215 disposed on the first tandem processing chamber 202 define a first processing region, while the sidewall 205B, interior wall 206 and portion of the lid 215 disposed on the second tandem processing chamber 203 defines a second processing region. The shared interior wall 206 isolates the processing environment of the tandem processing chambers 202 and 203 from each other. While the processing regions in the respective chambers are isolated, the tandem chambers 203 and 203 may share a common vacuum pump port 230, pump valve 221 (e.g., gate valve) and vacuum pump 220. As such, the lower portion of shared interior wall 206 may allow the first and second tandem processing chambers 202, 203 to communicate with each other. The lower portion of interior wall 206 is defined by a central pumping port 230.

The pump valve 221 couples the vacuum pump 220 to the pump port 230 through mounting flange 214. Therefore, the central vacuum pump 220 is generally configured to maintain the respective processing chambers 202, 203, at a pressure desired for workpiece processing and rapidly remove waste gases. The pump port 230 is positioned a distance from the processing chambers 202, 203 such as to minimize RF energy therein, thereby minimizing striking a plasma in the exhaust gases being flushed from the processing chambers 202 and 203. For example, the pump port 230 may be positioned in the shared interior wall 206 at a distance from the longitudinal chamber axis 213 of the chamber approximately equal to ½ the diameter of a processing chamber.

Figure 4A:
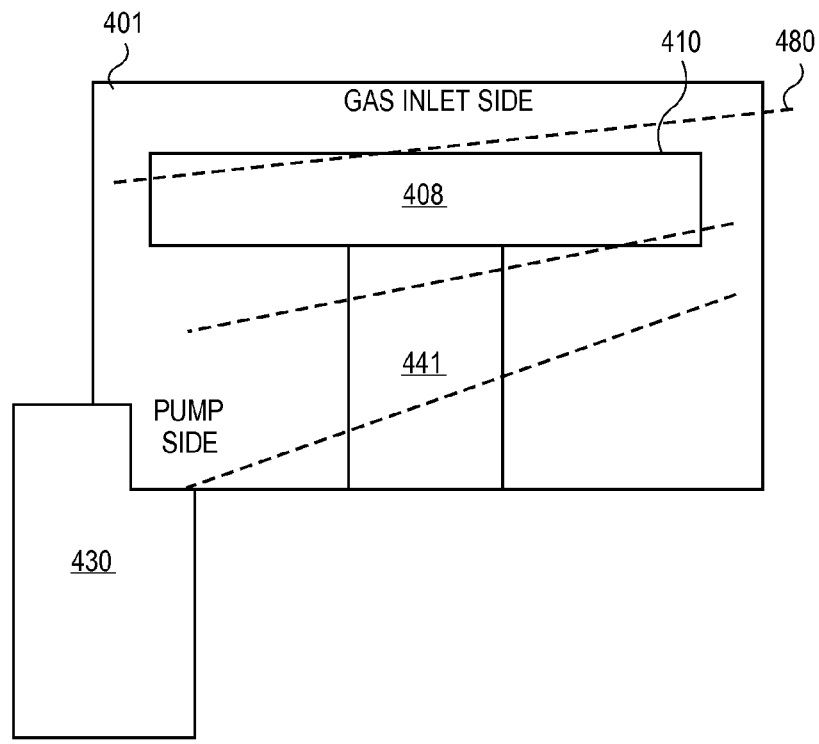
FIG. 4A illustrates conductance curves across a vacuum processing chamber illustrating a large conductance difference across a workpiece.

Because the pump port 230 is displaced from the longitudinal chamber axis 213, in operation, gas conductance can be expected to be asymmetrical, to some extent, about the longitudinal chamber axis 213. For example, FIG. 4A qualitatively illustrates conductance curves across a vacuum processing chamber 401 illustrating a large conductance difference across a top surface 410 of a workpiece support 408. As shown, the pump port 430, displaced from a stem 441 connecting the workpiece support 408 to a center of the processing chamber 401 pulls vacuum in a manner which causes a conductance difference across a radial dimension of the chamber. While the conductance difference decreases as the distance from the pump port 430 increases, toward the gas source side, an edge of a workpiece displaced on the workpiece support 408 will still be exposed to the conductance difference illustrated by the conductance curve 480.

In the exemplary embodiment depicted in FIGS. 2 and 3, a flow equalizer 250 is disposed between the workpiece support 208 and the pump port 230. FIG. 3 depicts an expanded view 275 of a portion of the flow equalizer 250 depicted in FIG. 2. As shown, the flow equalizer 250 may have an annular side surface 252 concentric about the workpiece support stem 241 to provide conductance symmetry about the workpiece support 208. The annular side surface 252 concentrically surrounds the stem 241 along the longitudinal chamber axis 213 and disposed a radial distance from the stem to form a radial gap ($G_{SYM}$) between the workpiece support 208 (i.e., stem 241) and the flow equalizer 250. Generally, the radial gap is smaller than a radial distance between the longitudinal chamber axis 213 and the pump port 230 to form a concentric gas conductance path about the center of the workpiece support 208. While the dimension of the radial gap may vary, the radial gap is between approximately 0.5 inches and 3 inches in exemplary embodiments. The axial length of the annular side surface 252, along a dimension parallel to the longitudinal chamber axis 213 is dependent on the height of the chamber sidewalls 205A,B and the interior wall 206, the thickness of the workpiece support 208 and the range of displacement the workpiece support 208 undergoes during a workpiece transfer to and from the processing chamber, as well as the desired flow characteristics (with greater axial length yielding greater conductance restriction). In contrast to a confinement ring, the flow equalizer 250 is disposed below, or downstream of, the lower workpiece support surface 211. Therefore, a relatively greater latitude in the amount of conductance restriction is afforded without directly impacting plasma processing of a workpiece disposed on the workpiece support top surface 210 (e.g., the flow restriction afforded by the flow equalizer 250 is not coupled to an electrode gap distance and the pressure control range may be significantly greater).

Figure 4B:
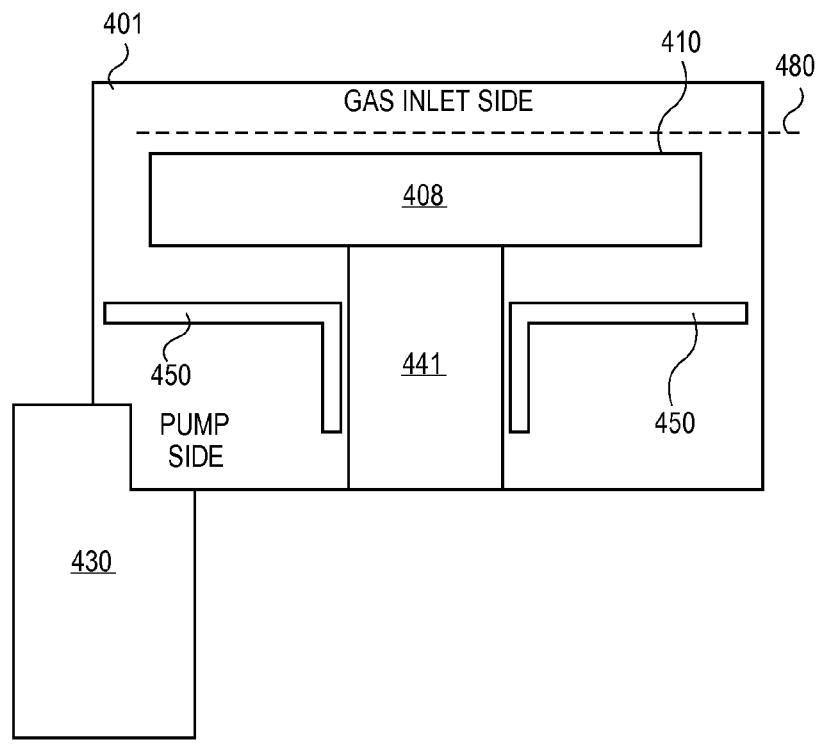
FIG. 4B illustrates conductance curves across a vacuum processing chamber in accordance with an embodiment, illustrating a reduced conductance difference across a workpiece.

As further depicted in FIG. 2 and FIG. 3, the flow equalizer 250 includes an annular top surface 251 facing the workpiece support lower surface 211, to form a longitudinal gap ($G_{CR}$) between the flow equalizer 250 and the workpiece support lower surface 211. Generally, the flow equalizer 250 may be dimensioned such that the annular top surface 251 has a radial length $R_3$-$G_{SYM}$, placing an outer radial edge proximate the sidewalls 205A,B and interior wall 206 to restrict gas flow between the chamber sidewalls and the flow equalizer 250. As such, a lowest resistance gas conductance path may generally follow the arrows depicted in FIGS. 2 and 3, toward the radial gap ($G_{SYM}$). The conductance restriction caused by the flow equalizer 250 directs gas flow toward the center of the chamber to help improve symmetry about the longitudinal chamber axis 213. The conductance symmetry proximate a top surface 210 of the workpiece support 208 may therefore be decoupled from the physical location of a pump port. FIG. 4B illustrates the conductance curve 480 across the vacuum processing chamber 401 qualitatively illustrating a reduced conductance difference across the workpiece support top surface 410 with the addition of the flow equalizer 450.

Returning to FIG. 2, specific dimensions of the annular top surface 251 are dependent on the chamber dimension. As an example, for an embodiment where the chamber radius is approximately 11 inches, the annular top surface 251 has a radial length of between approximately 5 and 8 inches. As the flow equalizer 250 may be exposed to plasma, the flow equalizer 250 may be of a dielectric material, such as, but not limited to quartz, alumina and yttrium, and the like.

In operation, embodiments of the tandem vacuum processing system 100 generally provide a processing system capable of performing processing on two workpieces simultaneously. The processes that can be performed include, but are not limited to, material deposition, etching, plasma treatment and thermal treatment. Although multiple workpieces may be processed simultaneously the processing may not proceed exactly simultaneously for various reasons. For example, any of these processes may be performed in manner which causes the process time for a given one of the tandem chambers to deviate slightly from the other. Incoming workpiece variation and chamber matching variation may necessitate termination of a vacuum process in one of the tandem chambers prior to termination of a vacuum process in the other of the tandem chambers. For plasma processes performed in the tandem vacuum processing system 100, such as an etch process, plasma density and ion density, which are directly related to the chamber process pressure, are important to control.

In an embodiment, the flow equalizer 250 is moveable during operation of a processing chamber to provide processing chamber pressure control independent of the pump valve 221. Because the flow equalizer 250 is disposed upstream of the pump port 230, pressure variations occurring at the pump port 230 may be isolated from the processing region upstream of the flow equalizer 250. In contrast to a confinement ring which is positioned on the gas source side of the workpiece support top surface 210 (e.g., upstream of the workpiece support 208), the position of the flow equalizer 250 relative to the chamber sidewalls 205A,B and interior wall 206 need not be modified with loading/unloading of a workpiece. Furthermore, any particulates generated from the motion of the flow equalizer 250 in the control of chamber pressure are downstream of the workpiece, rather than directly over the workpiece as is a confinement ring. Process cleanliness may therefore be expected to relatively better for the flow equalizer 250.

In one embodiment, the flow equalizer 250 may be positioned to modulate the size of the gap, $G_{CR}$, via movement of the flow equalizer 250 along the longitudinal chamber axis 213. The radial gap $G_{SYM}$ may therefore remain constant during the movement of the flow equalizer along the longitudinal chamber axis 213. As depicted in FIGS. 2 and 3, annular top surface 251 faces the lower surface 211 of the workpiece support 208 to vary a conductance restriction of the longitudinal gap ($G_{CR}$) as the flow equalizer 250 is moved along the longitudinal chamber axis 213. In one embodiment, such movement of the flow equalizer 250 is in response to a pressure control signal based on a pressure as measured in a processing region proximate to the top workpiece support surface 210. In one such embodiment, a manometer (e.g., 281 and 282 in FIG. 2) on the gas source side of the workpiece support 208 provides a process gas pressure signal from which a control signal may be generated to drive a displacement of the flow equalizer 250 during operation.

In the embodiment depicted in FIG. 2, the tandem processing chambers 202 and 203 each include a flow equalizer which is moveable and controlled independently of the other tandem chamber (e.g., the flow equalizer within processing chamber 202 is positioned based on a pressure measured by manometer 281 while the flow equalizer within chamber 203 is positioned based on a pressure measured by manometer 282) to variably restrict gas conductance independently within each tandem processing chamber 202 and 203. With each of the tandem processing chambers 202 and 203 including the flow equalizer 250, process pressure proximate to the workpiece support top surface 210 may be controlled independently between the first and second tandem processing chambers 202 and 203. Cross-talk between the chambers may therefore be reduced or eliminated even though the two chamber share a common vacuum pump 220 and/or a common pump port 230. For example, A process pressure in the first processing chamber 202 during a plasma process which may otherwise decrease when a plasma power in the second chamber 203 is turned off with an earlier process termination (e.g., because the crack-down gas pressure is higher that when plasma power is turned off and pumping speed is therefore increased in the first processing chamber 202), may be maintained through a repositioning of the flow equalizer 250 disposed in the first processing chamber 202.

In an embodiment, localized pressure control within each chamber achieved via the movable flow equalizer 250 to control the process pressure relatively higher than a pump side pressure to which the pump valve 221 is controlled. In one such embodiment, the pump valve 221 may be controlled to best maintain a pump side pressure setpoint as measured by a manometer 283 disposed between the flow equalizer 250 and the vacuum pump 220 (e.g., in the pump port 230 or in the mounting flange 214) while the flow equalizer 250 is controlled to best maintain a workpiece or gas source side pressure as sensed by the manometers 281 and 282. The flow equalizer 250 is displaced to variably restrict gas conductance symmetrically about the workpiece support 208 more or less depending on the responsivity of the pump valve 221. As such, high pump side pressures where a throttle gate valve position may be at less than 10% open may be avoided by providing pressure control with movement of the flow equalizer 250 which increases the workpiece or gas source side pressure.

Figure 5:
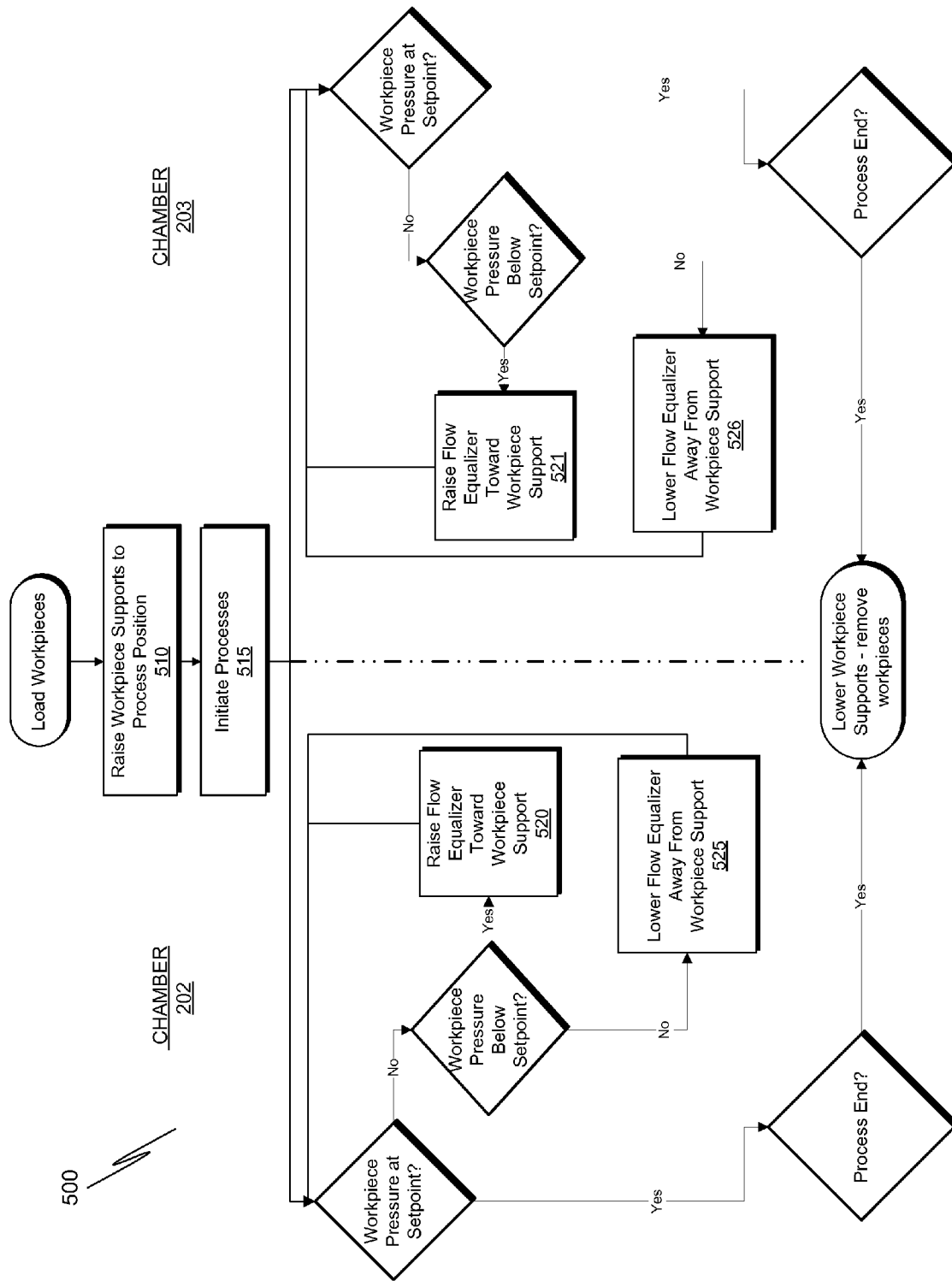
FIG. 5 illustrates a flow diagram for an exemplary method of independent pressure control in the tandem vacuum processing system depicted in FIGS. 1 and 2, in accordance with an embodiment.

FIG. 5 illustrates a flow diagram for an exemplary method 500 for independent pressure control in the tandem vacuum processing system 100. Method 500 begins with each of the processing chambers 202 and 203 loaded with a workpiece. At operation 510, the workpiece supports 208 are raised up toward the showerhead 222 in preparation for the process initiation which occurs at operation 515. At operations 520 and 525, the flow equalizer 250 disposed in the processing chamber 202 is raised and lowered to increase and reduce the workpiece process pressure toward a first process pressure setpoint. Similarly, at operations 521 and 526, the flow equalizer 250 disposed in the process chamber 203 is raised and lowered to increase and reduce the workpiece process pressure toward a second process pressure setpoint, which may or may not be the same as the first process pressure setpoint. Operations 520, 525, 521 and 526 proceed until the vacuum processing is terminated in each of the processing chambers 202 and 203, upon which the workpiece supports are lowered to a transfer position and the workpieces are unloaded.

To affect the movement of the flow equalizer 250 during operation of the processing chamber, the flow equalizer 250 may be mounted to one or more of the workpiece support 208, stem 241, chamber bottom 212 or chamber sidewalls 205A,B and interior wall 206 via a coupling which allows for driving of the flow equalizer 250 along the longitudinal chamber axis 213. For example, the flow equalizer 250 may be coupled to the workpiece support lower surface 211 or the chamber bottom 212 via one or more fixtures which can be extended and retracted in response to a pressure control signal. In an alternate embodiment, the flow equalizer 250 may be coupled to the stem 241 via one or more fixtures which can be driven along the length of the stem 241 in response to a pressure control signal. In such embodiments, the flow equalizer 250 is rendered moveable independently from the workpiece support 208 and/or stem 241.

Figure 6:
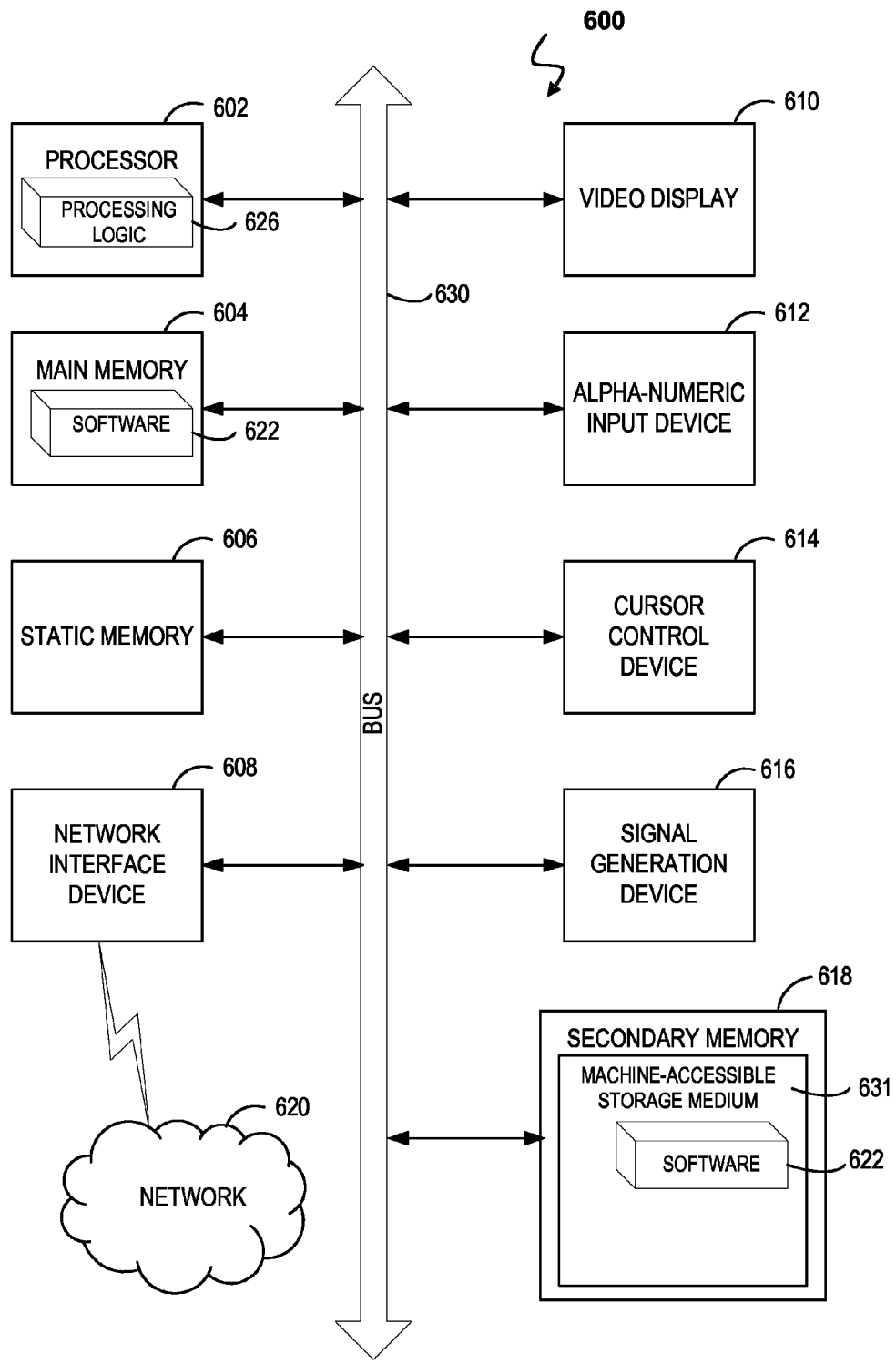
FIG. 6 illustrates a block diagram of an exemplary computer system, in accordance with one embodiment of the present invention.

FIG. 6 illustrates a diagrammatic representation of a controller in the exemplary form of a computer system 600 within which a set of instructions, for causing the vacuum processing apparatus to perform any one or more of the methodologies discussed herein, may be executed. The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations and steps discussed herein.

The computer system 600 may further include a network interface device 608. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

Embodiments of the present invention may be provided as a computer program product, which may include a computer readable storage medium having stored thereon instructions, which when executed by controller, cause the vacuum processing system 100 to process two workpieces. The flow equalizer 250 in each respective processing chamber 202 and 203, as controlled by the controller to a workpiece pressure setpoint, may vary position of the flow equalizer 250 as determined by the instructions stored on the computer-readable storage medium. The first and second flow equalizer 250, as controlled by the controller, may be positioned to provide an appropriate symmetrical flow conductance restriction to maintain a process pressure upstream of the flow equalizer 250 that is greater than a pressure downstream of the flow equalizer 250.

The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other commonly known types of computer-readable medium suitable for storing electronic instructions. Moreover, the present invention may also be downloaded as a computer program product, wherein the program may be transferred from a remote computer to a requesting computer over a wire.

It is to be understood that the above description is intended to be illustrative, and not restrictive. Many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense. The scope of the invention should, therefore, be determined with reference to the appended claims, along with the full scope of equivalents to which such claims are entitled.

What is claimed is:

1. A vacuum processing apparatus comprising:
   a workpiece support disposed along a longitudinal axis of a first vacuum processing chamber, the workpiece support having a top surface spanning a first radial distance from the longitudinal axis to hold the workpiece, and a lower surface opposite the top surface;
   a pump port disposed in a wall of the first vacuum processing chamber below the lower surface of the workpiece support to couple the first vacuum processing chamber to a vacuum pump; and
   a flow equalizer disposed in the first vacuum processing chamber between the lower surface of the workpiece support and the pump port, the flow equalizer movable, independent from the workpiece support, in response to a workpiece pressure control signal to variably restrict gas conductance downstream of the top surface of the workpiece support and upstream of the pump port, wherein the flow equalizer further comprises:
      an annular top surface spanning a second radial distance from the longitudinal axis wherein at least a portion of the annular top surface underlying the workpiece support and spaced apart from the workpiece support lower surface by a first gap in a direction parallel to said longitudinal axis, said first gap extending over a radial distance where the first and second radial distances overlap, the first gap modulated by the movement of the flow equalizer along the longitudinal chamber axis; and a side surface concentrically surrounding a stem of the workpiece support along the longitudinal chamber axis, the stem extending a third radial distance from the longitudinal axis that is less than the first radial distance, and the side surface disposed a radial distance from the stem to form a radial gap between the workpiece support and the flow equalizer which is smaller than a radial distance between the longitudinal chamber axis and the pump port, wherein the radial gap is fluidly coupled to the first gap to conduct gas from the first gap toward the pump port.

2. The vacuum processing apparatus as in claim 1, wherein the radial gap is to remain constant during the movement of the flow equalizer along the longitudinal chamber axis.

3. The vacuum processing apparatus as in claim 1, wherein the pump port is disposed in a sidewall of the first vacuum processing chamber with the radial distance between the longitudinal chamber axis and the pump port equal to approximately ½ an inner diameter of the first vacuum processing chamber.

4. The vacuum processing apparatus as in claim 1, further comprising a gate valve disposed between the pump port and the vacuum pump, the gate valve moveable in response to a vacuum pump side pressure control signal derived from a pressure measured downstream of the flow equalizer.

5. The vacuum processing apparatus as in claim 1, further comprising:
   a second vacuum processing chamber configured in tandem with the first vacuum processing chamber, the second vacuum processing chamber coupled to the vacuum pump through a second pump port, wherein the second pump port is disposed in a sidewall of the second vacuum processing chamber with the radial distance between a longitudinal axis of the second chamber and the second pump port equal to approximately ½ an inner diameter of the second vacuum processing chamber.

6. The vacuum processing apparatus as in claim 5, wherein the second vacuum processing chamber further comprises:
   a second flow equalizer disposed in the second vacuum processing chamber, the second flow equalizer movable in response to a second chamber pressure control signal to variably restrict gas conductance independently of the first flow equalizer.

7. The vacuum processing apparatus as in claim 1, further comprising a manometer on a gas source side of the top surface of the workpiece support to output a signal from which the workpiece pressure control signal is derived.

8. The vacuum processing apparatus as in claim 1, wherein the flow equalizer comprises a dielectric material selected from the group consisting of:
   quartz, alumina and yttrium.

9. The vacuum processing apparatus as in claim 1, wherein the workpiece support is moveable, independent from the flow equalizer, along the longitudinal chamber axis.

10. A vacuum processing system, comprising:
   a first vacuum processing chamber including a first workpiece support disposed therein, the first workpiece support having a top surface spanning a first radial distance from a longitudinal axis of the first chamber, and a lower surface opposite the top surface;
   a second vacuum processing chamber including a second workpiece support disposed therein and having a top surface spanning a first radial distance from a longitudinal axis of the second chamber, and a lower surface opposite the top surface, wherein the second vacuum processing chamber is positioned adjacent to the first vacuum processing chamber and isolated from the first vacuum processing chamber by a shared interior chamber wall, and wherein a pump port shared by the first and second vacuum processing chambers is disposed in the shared interior chamber wall, to couple the first and second vacuum processing chambers to a shared vacuum pump;
   a first movable flow equalizer disposed in the first vacuum processing chamber between the first workpiece support and the shared pump port; and
   a second movable flow equalizer disposed in the second vacuum processing chamber between the second workpiece support and the shared pump port, wherein each of the first and second flow equalizers further comprise:
   an annular top surface spanning a second radial distance from the longitudinal axis of the respective chamber wherein at least a portion of the annular top surface underlying the workpiece support and spaced apart from the workpiece support lower surface by a first gap in a direction parallel to said longitudinal axis, said first gap extending over a radial distance where the first and second radial distances overlap, the first gap modulated by the movement of the flow equalizer along the longitudinal chamber axis; and
   a side surface concentrically surrounding a stem of the workpiece support along the longitudinal axis of the respective chamber, the stem extending a third radial distance that is less than the first radial distance, and the side surface disposed a radial distance from the stem to form a radial gap between the workpiece support and the flow equalizer which is smaller than a radial distance between the longitudinal axis of the respective chamber and the pump port, wherein the radial gap is fluidly coupled to the first gap to conduct gas from the first gap toward the pump port.

11. The vacuum processing system as in claim 10, wherein the first and second flow equalizers are movable independent from each other in response to a chamber-specific pressure control signal to variably restrict gas conductance downstream of the workpiece support and upstream of the shared pump port.

12. The vacuum processing apparatus as in claim 10, further comprising a gate valve disposed between the shared pump port and the shared vacuum pump, the gate valve moveable in response to a vacuum pump side pressure control signal derived from a pressure measured downstream of the flow equalizer.

* * * * *